(12) United States Patent
Ready et al.

(10) Patent No.: US 7,559,619 B2
(45) Date of Patent: Jul. 14, 2009

(54) DIGITAL LITHOGRAPHY USING REAL TIME QUALITY CONTROL

(75) Inventors: Steven E. Ready, Santa Cruz, CA (US);
William S. Wong, San Carlos, CA (US);
Scott J. H. Limb, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 390 days.

(21) Appl. No.: 11/204,648

(22) Filed: Aug. 15, 2005

(65) Prior Publication Data

US 2007/0035597 A1 Feb. 15, 2007

Related U.S. Application Data

(60) Continuation-in-part of application No. 10/824,994, filed on Apr. 15, 2004, now Pat. No. 7,303,244, which is a division of application No. 10/224,701, filed on Aug. 20, 2002, now Pat. No. 6,890,050.

(51) Int. Cl.
*B41J 29/393* (2006.01)
(52) U.S. Cl. ................. 347/19; 347/1; 347/2; 347/12
(58) Field of Classification Search .............. 347/19, 347/1, 2, 12
See application file for complete search history.

(56) References Cited

U.S. PATENT DOCUMENTS 5,751,305 A * 5/1998 Hadley ..................... 347/19
6,164,745 A * 12/2000 Nagoshi et al. ............. 347/15
6,648,470 B2 * 11/2003 Korem ...................... 347/106
6,742,884 B2    6/2004 Wong et al.
2003/0189604 A1 * 10/2003 Bae et al. ..................... 347/2
2004/0021732 A1 *  2/2004 Van den Bergen ........... 347/41
2004/0036731 A1 *  2/2004 Ready et al. ................. 347/19

* cited by examiner

*Primary Examiner*—Manish S Shah
*Assistant Examiner*—Laura E Martin
(74) *Attorney, Agent, or Firm*—Bever, Hoffman & Harms, LLP; Patrick R. Bever

(57) ABSTRACT

A digital lithography system including a droplet source (printhead) for selectively ejecting liquid droplets of a phase-change masking material, and an imaging system for capturing (generating) image data representing printed features formed by the ejected liquid droplets. The system also includes a digital control system that detects defects in the printed features, for example, by comparing the image data with stored image data. The digital control system then modifies the printed feature to correct the defect, for example, by moving the printhead over the defect and causing the printhead to eject droplets onto the defect's location. In one embodiment, a single-printhead secondary printer operates in conjunction with a multi-printhead main printer to correct defects.

19 Claims, 4 Drawing Sheets

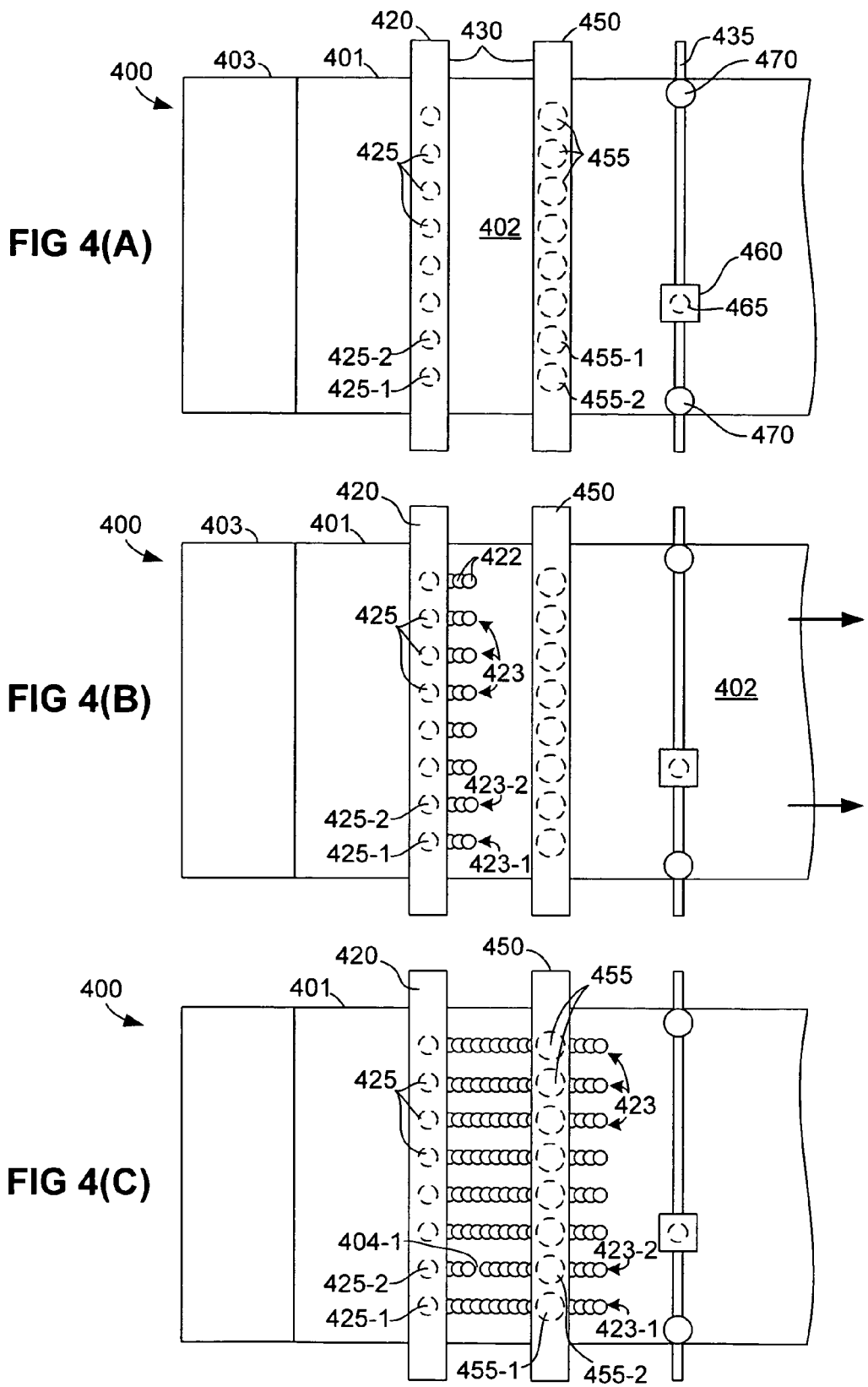

DIGITAL LITHOGRAPHY USING REAL TIME QUALITY CONTROL

CROSS-REFERENCE TO RELATED APPLICATIONS

The present application is a continuation-in-part of co-owned U.S. application Ser. No. 10/824,994, filed Apr. 15, 2004, now U.S. Pat. No. 7,303,244 entitled "Method for the Printing of Homogeneous Electronic Material with a Multi-Ejector Print Head", which is a division of U.S. application Ser. No. 10/224,701, filed Aug. 20, 2002, now U.S. Pat. No. 6,890,050.

This invention was made with Government support under 70NANBOH3033 awarded by NIST/ATP. The Government has certain rights in this invention. Further, this invention relates to generally to the field of integrated circuit (IC) device processing and, more particularly, to digital lithographic techniques where a surface is masked by ejecting droplets of a phase-change masking material from a droplet source in accordance with predetermined printing data.

FIELD OF THE INVENTION

BACKGROUND OF THE INVENTION

In recent years, the increasingly widespread use of display device alternatives to the cathode ray tube (CRT) has driven the demand for large-area electronic arrays. In particular, amorphous silicon and laser re-crystallized polycrystalline silicon (poly-silicon) are used to drive liquid crystal displays commonly used in laptop computers. However, fabricating such large-area arrays is expensive. A large part of the fabrication cost of the large-area arrays arises from the expensive photolithographic process used to pattern the array. In order to avoid such photolithographic processes, direct marking techniques have been considered an alternative to photolithography.

An example of a direct marking technique used in place of photolithography involves utilizing a xerographic process to deposit a toner that acts as an etch mask. However, toner materials are hard to control and difficult to remove after deposition.

Another example of a direct marking technique involves "digital lithography" in which a droplet source including, for example, an inkjet printhead, is used to deposit a liquid mask onto a substrate in accordance with predetermined printing data. A problem with digital lithography is that inkjet printing of functional devices is susceptible to several defect creation processes during the printing operation: misdirected ejection, ejection failure, droplet/spot size variation, alignment error, etc. In most device printing applications, single defects, depending on their nature, will result in a device that will not function to specifications.

It is highly desirable to develop robust digital lithography methods that maximize yields. Currently, the method of quality control for micro electronic and optical pattern formation by digital lithography involves post-printing inspection of the pattern after the entire substrate is patterned. Feedback is, at best, available to the process for subsequent pattern formations, but such feedback information is essentially useless when applied to patterns printed onto large flexible sheets, which often exhibit random surface distortions due to stretching or local stresses. In rare instances, post-processing may be attempted to correct printing errors. However, such corrections are performed well after deposited materials have gone through a phase change (i.e., assumed a solid form), thereby producing inferior correction results because the corrective liquid mask may not adhere well to the already-solid mask material.

What is needed is a digital lithography system that includes real-time quality control in the form of real-time monitoring and modification of the digital lithography process in order to improve the positional accuracy of printed features, and to improve the quality of corrected printed structures on flexible and rigid substrates.

SUMMARY OF THE INVENTION

The present invention is directed to a digital lithography system in which an integrated imaging and printhead control system is used to perform real-time quality control in order to improve the positional accuracy of printed features, and to improve the quality of corrected printed structures on flexible and rigid substrates. Thus, digital lithography performed in accordance with the present invention facilitates the repair of printed defects such as missing, misaligned, or small spots. Unlike conventional photolithography where the entire layer has to be reworked in order to repair defects, the present invention provides for the selective correction of defects "on the fly" (i.e., as they occur and/or are identified).

In accordance with an embodiment of the present invention, the integrated printing/imaging system analyzes the substrate immediately before and/or after the printing of material. The imaging system includes a camera that is, in one embodiment, tightly mechanically coupled with the droplet source (printhead) with sufficient relative accuracy to insure positional accuracy between the captured image data and the printed features. The captured image data is compared with stored (expected) image data by a central processing unit (CPU) to determine the pattern integrity and/or any of a number of printing material characteristics, thereby providing information regarding errors in the quality of the printing operation in real time. This error information is then used to control the droplet source in order to modify the printing data to include corrective printing operations. Such modifications include, for example, changing the printhead position due to dimensional changes to the substrate, controlling the printhead to deposit additional material at a selected location, and modifying the printing conditions. Because the error correction is performed in real time, the additional material can be deposited on the originally printed material before phase change is complete, thereby providing a high quality error correction that avoids problems associated with conventional digital lithography methods.

In accordance with an embodiment of the present invention, printed features are formed using a main printer, the printed features are analyzed immediately after printing by the imaging system, and defects in the printed features are corrected using a single ejector printhead before the ejected phase change material has a chance to solidify. The imaging system analyzes the substrate for printed features exhibiting repairable defects, and information about the location and type of repair is utilized to control the single ejector printer. The main printer, optical defect recognition system, and single ejector printer are incorporated into an integrated imaging/printer control system. This enables defect correction in a digital lithography system that prints features onto a rolled (flexible) substrate.

In accordance with another embodiment of the present invention, a method for real time correction includes providing another "roaming" camera that scans for alignment marks independently of the main printhead and camera.

BRIEF DESCRIPTION OF THE DRAWINGS

These and other features, aspects and advantages of the present invention will become better understood with regard to the following description, appended claims, and accompanying drawings, where:

FIGS. 4(A), 4(B), 4(C), 4(D), and 4(E) are top views showing a simplified digital lithography system according to another embodiment of the present invention.

DETAILED DESCRIPTION OF THE DRAWINGS

As used herein, the terms "phase-change masking material" and "phase-change material" refer to compounds or elements that changes in phase from a liquid to a solid, or in some embodiments from a liquid to a gas. In one embodiment of the invention, the phase change material have low melting points (also called freezing point) below 150° C. with a narrow transition temperature range. The phase-change masking material may also be mixtures or dispersions without precise freezing temperatures. However, even without specific freezing temperatures, these materials still retain the characteristic of transitioning from a substantially liquid phase to a substantially solid phase in a narrow temperature range. In one particular embodiment of the invention, the phase change material is an organic material such as a wax that has a melting point between 60 degrees and 100 degrees centigrade. An additional characteristic of the phase-change masking material is that a mask formed by the phase-change masking material should be robust enough to withstand wet-chemical or dry etching processes. When a dry etching process is used, phase change masking materials with low-vapor pressures may be used. Wax is an example of a phase-change material with the previously described characteristics. Examples of suitable waxes for use as a phase-change masking material are Kemamide 180-based waxes from Xerox Corporation of Stamford, Conn.

Figure 1:
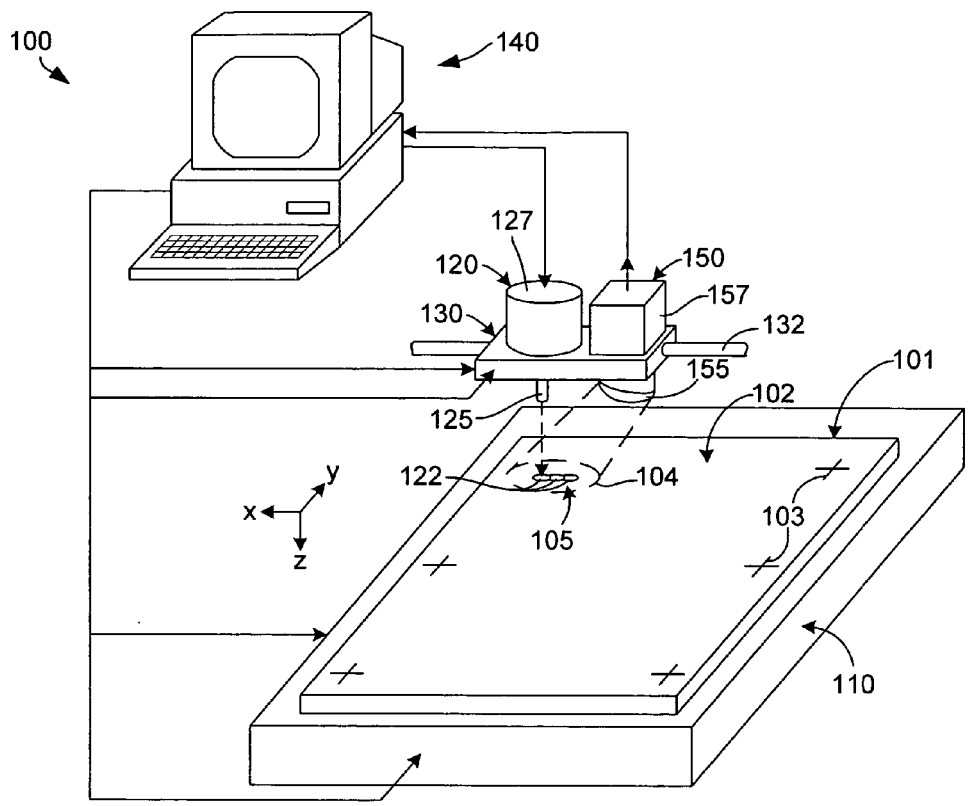
FIG. 1 is partial prospective view showing a simplified digital lithography system according to an embodiment of the present invention.
Figure 2:
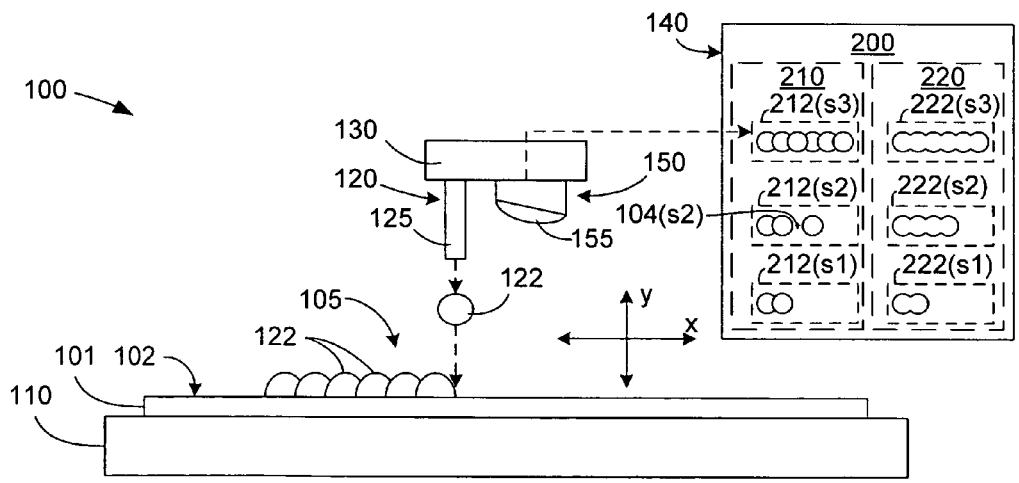
FIG. 2 is a side view showing a portion of the digital lithography system of FIG. 1.

FIGS. 1 and 2 show a simplified digital lithography system 100 including real-time quality control of printed features formed on a substrate 101 according to an embodiment of the present invention. Substrate 101 is placed or otherwise supported on a platen 110 below a droplet source 120, which is suspended over platen 110 by way of a support structure 130. In a manner similar to conventional digital lithography systems, printing operations performed by droplet source 120 are controlled by a digital control system 140 (e.g., a computer or other logic circuit programmed or otherwise configured to perform the various functions described herein). During these printing operations, droplets 122 of phase-change masking material are ejected in the z-axis direction onto upper surface 102 of substrate 101 while substrate 101 and droplet source 120 are moved relative to each other in the x-axis and/or y-axis directions, whereby printed features 105 are formed by contiguous droplets 122 that are deposited and solidify on upper surface 102 of substrate 101.

Substrate 101 typically includes a thin film of semiconductor material or a thin-film metal such as aluminum, but may comprise other materials. In one specific embodiment (described in additional detail below), substrate 101 comprises a flexible sheet that is rolled into a cylindrical roll (i.e., rolled around an axis), and is fed out onto platen 110 to facilitate high-volume production. Substrate 101 is maintained at a temperature such that droplets 122 cool and solidify (i.e., undergo a phase change) after deposition. In some embodiments of the invention, a wetting agent, typically a dielectric material such as silicon dioxide, $SiO_2$ or silicon nitride, $Si_3N_4$ may be included on the surface to assure that sufficient wetting occurs to make a good contact between the mask and the substrate.

Platen 110 and support structure 130 cooperatively form a positioning apparatus that is controlled by digital control system 140 to operably position droplet source 120 relative to a selected region of substrate 101 during the printing process. In particular, digital control system 140 transmits positional commands to at least one of platen 110 and support structure 130, whereby droplet source 120 is moved in the X-axis and Y-axis directions until it is operably positioned over a predetermined substrate location (e.g., region 104) of substrate 101 for ejection of a droplet. After a droplet of marking material is deposited on substrate 101, the relative positions of substrate 101 and droplet source 120 are adjusted to reposition droplet source 120 over a second position to be masked. The positioning and repositioning operations may be achieved either by moving droplet source 120 or by moving substrate 101 via platen 110. In one embodiment, a motor moves support structure 130 along at least one rail 132 in a predetermined X-axis and/or Y-axis direction pattern over substrate 101, thereby positioning droplet source 120 over the predetermined substrate locations. Alternatively, or in addition, substrate 101 is positioned relative to droplet source 120 by way of a motor and rail system (not shown) that moves platen 110 in the X-axis and/or Y-axis directions. In addition, digital control system 140 transmits print (ejection) commands to droplet source 120 such that phase-change masking material droplets 122 are selectively ejected in liquid form onto predetermined substrate location 104 once the positioning operation is completed, thereby causing the elected droplets 122 to form at least part of a printed feature 105 at the predetermined substrate location 104. By coordinating the movement of droplet source 120 with the timing of droplet source outputs, a masking pattern (printed feature) is "printed" on substrate 101.

As indicated in FIG. 1, droplet source 120 includes one or more printheads 125 for ejecting droplets 122, a reservoir 127 for holding the phase-change masking material in a liquid form, and a conduit (not shown) for feeding the liquid phase-change masking material from reservoir 127 to printhead 125. Printhead 125 includes a driver circuit that operates in response to the print commands received from digital control system 140 to eject droplets 122 onto substrate 101. Reservoir 127 typically includes a heat source (not shown) that the phase-change masking material to a temperature that is sufficient to maintain the phase-change masking material in a liquid state until it is ejected by printhead 125 and deposits on a designated surface (e.g., substrate 101). Droplet source 120 may be implemented using a variety of technologies including traditional ink-jet technology (i.e., an ink-jet printhead). An alternative technology well-suited for generating extremely small droplet sizes is the use of sound waves to cause ejection of droplets of masking material as done in acoustic ink printing systems. In acoustic in printing systems, a source of acoustic waves, such as a piezo electric driver, generates acoustic waves in a pool of liquid phase change masking material. An acoustic lens focuses the acoustic waves such that a droplet of phase change masking material is ejected from the surface of the liquid pool. The droplet is then deposited on substrate 101 as described above.

In order to minimize the possibility of partial midair freezing of droplets in the Z-axis space between printhead 125 and substrate 101, an electric field may be applied to accelerate droplets 122 from printhead 125 to substrate 101. The electric field may be generated by applying a voltage, typically between one to three kilovolts between printhead 125 and a platen 110 under substrate 101. The electric field minimizes droplet transit time through space and allows substrate surface temperature to be the primary factor controlling the phase change operation. Moreover, the increased droplet velocity in space improves the directionality of the droplet allowing for improved straight-line features.

In accordance with an aspect of the present invention, digital lithography system 100 further includes an imaging system 150, which functions to generate image data associated with selected regions of substrate 101 (e.g., printed feature 105 formed in predetermined substrate location 104), and to transmit this image data to digital control system 140 for real-time analysis. In one embodiment, imaging system 150 includes a digital camera having a lens 155 and image data generating circuitry 157 that are mounted on support platform 130 (i.e., fixedly connected to droplet source 120 by way of rigid support platform 130). In particular, lens 155 is mounted next to printhead 125 of droplet source 120 and arranged such that lens 155 captures images from the region of substrate 101 located directly below printhead 125, whereby imaging system 150 is configured to selectively capture images (pictures) of predetermined substrate locations 104 of substrate surface 102 immediately before and/or immediately after droplet source 120 ejects a particular droplet 122 onto the associated substrate location. Further, because droplet source 120 and imaging system 150 are fixedly mounted to support platform 130, movement of support 130 results in parallel movement of both droplet source 120 and imaging system 150, thus automatically positioning lens 155 over predetermined substrate locations 104 during the ejection (printing).process. Each successive image (still picture) captured by lens 155 is converted into an associated digital image data portion by circuitry 157 using known techniques, and then circuitry 157 transmits these image data portions to digital control system 140. By mounting imaging system 150 next to droplet source 120 on support platform 130, lens 155 is tightly mechanically coupled to printhead 125 with sufficient relative accuracy to insure positional accuracy between the image data portions and the predetermined surface locations on which droplets are printed at each stage of the digital lithography procedure. Accordingly, imaging system 150 is able to facilitate optimal real time quality control by generating image data from the predetermined substrate location immediately before and/or immediately after each printing process.

In accordance with another aspect of the present invention, digital control system 140 compares the image data portions provided by imaging system 150 with stored (i.e., expected or "known good") image data. As graphically depicted in FIG. 2, digital control system 140 includes a memory 200 having a captured image data section 210 and a stored image data section 220. In accordance with a predetermined process executed by digital control system 140, image data portions captured at predetermined stages of the printing process by imaging system 150 are stored in captured image data section 210, and then compared with stored image data portions representing expected captured image data at each of the predetermined stages. For example, a captured image data portion 212(s1), which was captured at an early stage ("s1") of the printing process (i.e., when two droplets are printed on the substrate) is stored in section 210, and then compared with a corresponding stored image data portion 222(sl) that represented the expected image data at that early stage. Similarly, captured image data portions 212(s2) and 212(s3) are captured at corresponding subsequent stages ("s2"and"s3") of the printing process and stored in section 210, and then compared with corresponding stored image data portions 222(s2) and 222(s3), respectively, that represented the expected image data at those stages. Note that the stored image data may take several forms. Comparison algorithms could use stored image parametric information to perform the comparison process, or pattern information from the design file used in the rendering the pattern to be printed, or a prototypical pattern gathered from imaged features formed on the substrate periphery.

In accordance with another aspect of the present invention, digital control system 140 selectively modifies erroneous (i.e., imperfect) printed features 105 in response to results generated during the comparison process. Feature errors detected in this manner may include feature location, feature size, feature component, printer spot placement, optical features of the deposited material, material quantity, material height and extents, surface and edge roughness. When a captured image data portion (e.g., portion 212(sl)) is substantially identical to the corresponding image data (e.g., portion 222(s1)), then the printing process is allowed to proceed uninterrupted. Conversely, when a captured image data portion (e.g., portion 212(s2)) is significantly different from its corresponding image data (e.g., portion 222(s2)) due, for example, to a void at a location 104(s2) caused by the failure of droplet source 120 to eject a droplet onto location 104(s2) according to the printing procedure, then the printing process is interrupted, and droplet source 120 is repositioned (i.e., caused to "go back" over location 104(s2)), and then caused to eject a droplet into the void, thus correcting the printing defect. The printing process is then resumed. Accordingly, digital lithography system 100 is able to facilitate optimal real time quality control by identifying printing errors and immediately repositioning printhead 125 and ejecting one or more corrective droplets 122 into an unwanted void before the previously ejected droplets surrounding the void have had a chance to solidify, thus improving the quality of corrected printed features by facilitating "fusing" of the corrective droplets with the previously printed droplets.

Figure 3:
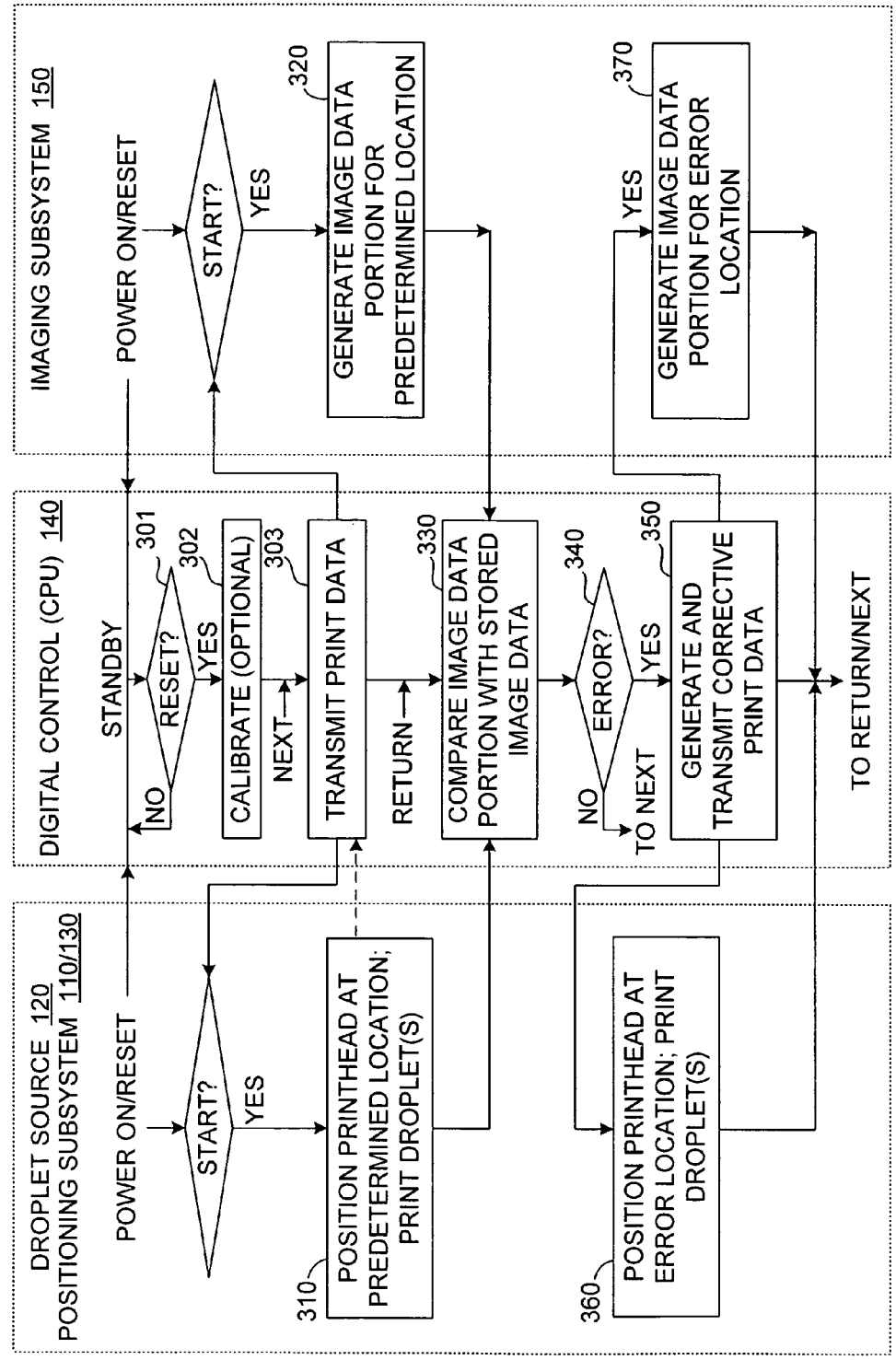
FIG. 3 is a flow diagram showing a printing operation performed by the digital lithography system of FIG. 1 according to another embodiment of the present invention.

FIG. 3 is a simplified flow diagram depicting procedures performed by the various subsystems of digital lithography system 100 (see FIGS. 1 and 2) during an exemplary digital lithography (printing) process in accordance with an embodiment of the present invention. Each of the three columns depicted in FIG. 3 includes functions performed by one or more subsystems of digital lithography system 100, and signals transmitted between the various subsystems are depicted by arrows passing between the three columns. In particular, the leftmost column depicts droplet ejection functions performed by droplet source 120, and printhead positioning functions performed by platen 110 and/or support substrate 130. The rightmost column depicts image capture functions performed by imaging system 150. The central column depicts control functions performed by digital control system (central processing unit, or CPU) 140.

Referring to the upper end of the three columns, power on/reset signals are generated and transmitted to CPU 140 by the various subsystems to indicate that digital lithography system 100 is ready to perform a printing process (i.e., "YES" in reset block 301).

Next, an optional setup (calibration) operation (block 302) is then performed to verify positional accuracy between the captured image data and the location at which the printhead (ejectors) deposits ejected droplets. Position marks 103 (FIG.

1) may be formed along the edges of substrate 101 for purposes of ejecting drops and measuring relative positions via captured image data. The relative position information is then utilized to align the substrate to the printhead, as well as provide a tightly coupled print quality evaluation machine vision architecture.

The printing operation is then initiated by accessing print data and using the print data to position support structure 103 such that printhead 125 is located over an initial predetermined substrate location 104.

In accordance with an embodiment of the present invention, imaging system 150 is utilized to generate initial image data associated with the initial predetermined substrate location (block 320), and to analyze the initial image data for flaws or defects in the substrate surface immediately before printing commences (block 330). This analysis can be used to modify the printing conditions, or to make changes to the printing position due to dimensional changes to the substrate (blocks 340 and 350). For example, when flexible substrates are used, local stretching of the substrate material may cause an alignment mark (e.g., marks 103; see FIG. 1) to be displaced from an expected location, and the pre-printing analysis may be used to adjust the position of printhead 125 prior to printing. In another example, when the printing process involves the formation of a mask over previously formed integrated circuit structures, the pre-printing analysis may be used to perform instantaneous layer registration and compensated alignment of the mask to the erroneously formed structures located under the mask. Using pre-printing information in this manner, digital lithography system 100 facilitates increased yields by adjusting in real-time to local distortions and flaws in previously formed features.

In accordance with another embodiment of the present invention, imaging system 150 is utilized to generate posting-printing image data in the manner described above to correct printing errors. The droplet source, which is positioned in the manner described above over the initial printing location in response to positioning data transmitted from CPU 140, is caused to eject droplets onto the underlying substrate, also in response to print data transmitted from CPU 140 (blocks 303 and 310). Once printhead 125 has completed a predetermined printing operation (e.g., after a predetermined time period or in response to feedback signals from droplet source 120), CPU 140 sends command signals to imaging system 150 to generate initial image data associated with the printed feature (blocks 303 and 320), and compares/analyzes the resulting image data portion for flaws or defects (block 330). This analysis can be used to modify the printing operation in the manner described above to fill a void or correct some other flaw, or to modification to control aspects of the material deposition (blocks 340 and 350). Depending on the decision structure and nature of the information fed back to CPU 140, the modification possibilities could directly affect the current printing in motion, or it could require additional printing tasks in the current printing job to fix substandard deposition features. When additional printing tasks are required, CPU transmits printhead position and droplet ejection signals to the droplet source and positioning subsystem to perform the desired corrective function (block 360). An optional correction verification operation may be used to generate associated image data (block 370), which in turn may be analyzed by CPU 140 to verify that error correction was performed successfully. Once the error correction is completed, control returns to the main printing operation, and the next printing operation is commenced (block 303).

While the above operation has been described with reference to a single printhead 125 and a single imaging system 150, multiple droplet sources and multiple imaging systems may be used to facilitate high throughput printing operations. Moreover, imaging system 150 is not restricted to being mounted next to printhead 125. In one embodiment, multiple cameras may be used, each camera positioned to capture image data from an associated "assigned" region of substrate 101. Moreover, depending on the substrate and device structure to be printed, the camera(s)/illuminators could be positioned on either side of a transparent substrate, or on opposite sides of the substrate either to provide for imaging different aspects of the current pre-and/or post-pattern, or to locate the imaging system closer to the printing operation. This arrangement may also provide a mechanism for monitoring the printing operation dynamically.

FIGS. 4(A) to 4(E) are top views showing a simplified digital lithography system 400 including an optical defect recognition arrangement according to another embodiment of the present invention.

Referring to FIG. 4(A), a substrate 401 is passed between a platen (not shown) and one or more support structures 430 that support a main printer (droplet source) 420 and an imaging system 450. In this embodiment, substrate 401 is rolled at one end into a cylindrical roll 403, and includes a flat (unrolled) section having an upper surface 402 that faces upward toward main printer 420 and imaging system 450. Main printer 420 includes several printheads 425 that are arranged in a row and positioned over upper surface 402 in a manner similar to that described above. Imaging system 450 is located downstream from main printer 420 and includes multiple cameras, each camera having a lens 455 aligned with a corresponding printhead 425 of main printer 420. For example, lens 455-1 is positioned downstream from printhead 425-1, and lens 455-2 is positioned downstream from printhead 425-2. In addition, system 400 includes a secondary printer (second droplet source) 460 having a single ejector printhead 465 that is movably (e.g., slidably) mounted on an associated support structure 435 and located downstream from imaging system 450. Optional alignment cameras 470 are fixedly mounted on support structure 435 to confirm alignment/positioning of secondary printer 460 during defect repair operations.

Figure 4D:
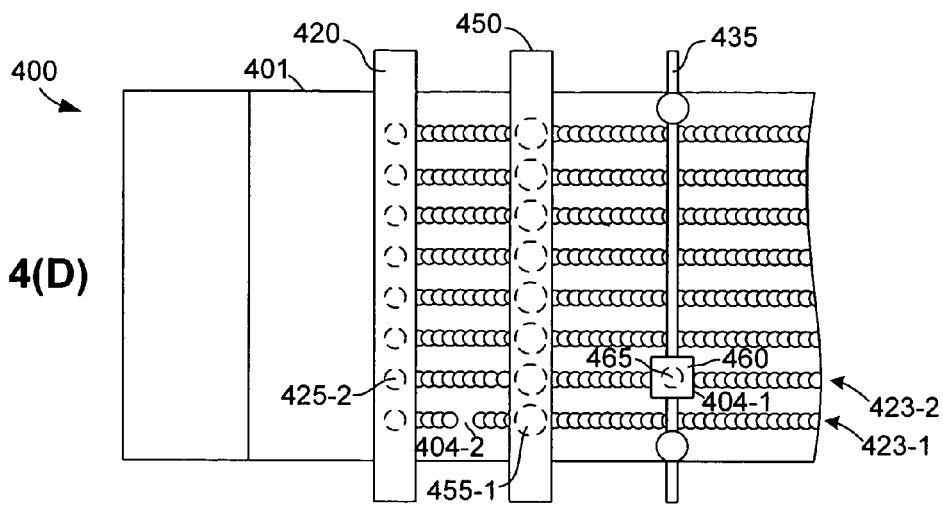

FIGS. 4(B) to 4(E) illustrate a printing operation in which substrate 401 is unrolled from a cylindrical roll 403 in the travel direction indicated by the arrow in FIG. 4(B), and printed features are formed on upper surface 402 by causing printheads 425 of main printer 420 to eject droplets 422 in the manner described above. For sake of simplifying the discussion, each printhead 425 is controlled to print elongated straight line 423 (e.g., printhead 425-1 prints elongated line 423-1, and printhead 425-2 prints elongated line 423-2). Two-dimensional features are formed, for example, by shifting main printer 420 perpendicular to the travel direction, as is understood by those skilled in the art.

As indicated in FIG. 4(C), each elongated line 423 generated by a printhead 425 a passes under a corresponding camera lens 455, thus enabling optical verification that each of the elongated lines 423 is printed accurately (e.g., using the capture and comparison operation, described above, for each image data portion generated by each camera). For example, elongated line 423-1 passes under camera lens 455-1, which is used to periodically capture first image data portions. Similarly, elongated line 423-2 passes under camera lens 455-2, which is used to periodically capture second image data portions. Each of the captured image data portions is passed to a system CPU (not shown), which in turn compares the image data portion to stored image data (or otherwise analyzes the image data portion) to detect voids or other flaws in the corresponding printed feature.

Figure 4E:
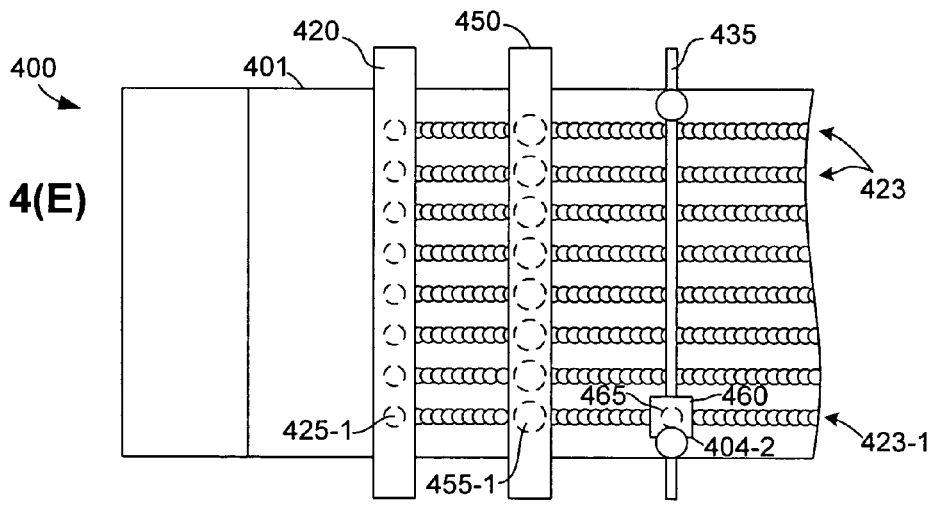

In accordance with the present embodiment, secondary printer 460 is utilized to correct defects at generated by any of the printheads 425 of main printer 420 by positioning (i.e., moving, if necessary) printhead 465 over a detected defect, and causing printhead 465 to eject one or more droplets onto the defect location as substrate 401 passes beneath secondary printer 460. For example, FIG. 4(C) indicates a defect in printed feature 423-2 at a defect location 404-1. Immediately after this defect is produced, for example, by a temporary malfunction of printhead 425-2, and substrate 401 is shifted such that defect location 404-1 passes under lens 455-2, which generates image data that is passed to the digital controller system (now shown), which detects the defect using the methods described above. As indicated in FIG. 4(D), in response to the detection of the defect at defect location 404-1, the digital controller system then transmits positioning control signals to secondary printer 460, whereby printhead 465 is positioned over printed feature 423-2. Subsequently, when substrate is moved under support structure 435 and defect location 404-1 is moved under single printhead 465, the digital controller system transmits a print control signal that causes single printhead 465 to eject one or more droplets onto defect location 404-1. Similarly, as indicated in FIG. 4(D), a subsequent defect produced in printed feature 423-1 at a second defect location 404-2 is detected using image data captured by lens 455-1. As indicated in FIG. 4(E), this defect detection information is then used to reposition single printhead 465 of secondary printer 460 over second defect location 404-2 to perform a repair operation. By incorporating the repair mechanism (e.g., secondary printer 460) downstream from primary printer 420, the printing operation performed by primary printer 420 may proceed uninterrupted, thereby optimizing production times. Further, by using single printhead 465 (i.e., instead of a duplicate version of main printer 420), overall system production costs are minimized.

Although the present invention has been described with respect to certain specific embodiments, it will be clear to those skilled in the art that the inventive features of the present invention are applicable to other embodiments as well, all of which are intended to fall within the scope of the present invention. For example, an alternative method for real time correction includes providing another "roaming" camera that scans for alignment marks independently of the main printhead and camera. The roaming camera looks for existing alignment marks on the substrate surface. A separate control system can be used to acquire the data obtained and process the information to be fed back to the main controller. These alignment marks are located in areas close to the patterning area so that a best estimate for the localized distortion can be obtained. The "roaming" camera is mounted on a separate stage controller. The camera will image the substrate "upstream" of the patterning area and send information that can be used for correcting localized distortions.

The invention claimed is:

1. A digital lithography system including real-time quality control of printed features formed on a substrate, the system comprising:
 a first droplet source for selectively ejecting liquid droplets of a phase change material;
 a digital control system for positioning the first droplet source over a predetermined substrate location on a surface of the substrate, and for controlling the first droplet source to selectively eject a plurality of first liquid droplets in accordance with predetermined printing data such that the ejected first liquid droplets form at least part of a printed feature located at the predetermined substrate location;
 an imaging system for generating an image data portion representing the part of the printed feature formed by the ejected first liquid droplets at the predetermined substrate location,
 wherein the imaging system is fixedly attached to the first droplet source such that movement of first droplet source results in parallel movement of the imaging system, and
 wherein said digital control system includes means for comparing each image data portion with stored image data, and means for modifying the printed feature in response to said comparing process.

2. The system according to claim 1, wherein the substrate comprises one of a semiconductor thin film, a metal thin film, and a dielectric thin film.

3. The system according to claim 2, further comprising a platen positioned below the first droplet source, wherein the substrate comprises an elongated sheet having a rolled portion rolled around an axis, and a flat portion supported on the platen.

4. The system according to claim 1, wherein the first droplet source comprises one of an ink-jet printhead and an acoustic ink printhead operably coupled to an ink reservoir.

5. The system according to claim 4, wherein the phase change material comprises one of an organic material and a wax.

6. The system according to claim 1, wherein the digital control system comprises one of a computer and a logic circuit operably configured to perform the comparing function, the droplet source positioning control function, and the droplet eject control function.

7. The system according to claim 6, wherein the digital control system comprises means for moving the droplet source and imaging system relative to the substrate.

8. The system according to claim 6, wherein the digital control system comprises means for moving the substrate relative to the droplet source and imaging system.

9. The system according to claim 1, further comprising a support structure mounted over the substrate, wherein the first droplet source comprises a printhead fixedly attached to the support structure, and wherein the imaging system comprises a camera lens fixedly attached to the support structure adjacent to the printhead and arranged such that said camera lens captures images from a region located directly below the printhead.

10. The system according to claim 1, wherein the imaging system and droplet source are located on opposite sides of the substrate.

11. The system according to claim 1, wherein said means for modifying comprises means for ejecting a second liquid droplet onto the substrate at the selected location before the first liquid droplet solidifies.

12. The system according to claim 11, wherein said means for comparing comprises means for detecting voids in at least one of the printed features, and wherein said means for modifying comprises means for
 positioning the droplet source over the void and controlling the droplet source to eject at least one liquid droplet onto the void.

13. The system according to claim 1, further comprising means for analyzing the substrate immediately before ejecting a first droplet, and for modifying the predetermined printing data in accordance with the analysis.

14. The system according to claim 11, further comprising a second droplet source, wherein said means for comparing includes means for detecting a defect at a corresponding defect location in at least one of the printed features, and wherein said means for modifying comprises means for controlling the second droplet source to eject at least one liquid droplet onto the defect location.

15. The system according to claim 14,
wherein the first droplet source comprises a plurality of spaced-apart printheads arranged to simultaneously generate a plurality of printed features in response to control signals received from the digital control system,
wherein the imaging system comprises a plurality of lenses arranged to simultaneously capture image data portions of each of the plurality of printed features,
wherein the second droplet source comprises a single printhead that is movably disposed over the substrate, and
wherein the means for modifying further comprises means for positioning the single printhead over the defect location in any of the plurality of printed features, and for controlling the printhead to eject one or more droplets onto the defect location.

16. The system according to claim 1, further comprising a second imaging camera mounted on a motion stage such that the second imaging camera is movable relative to the first droplet source.

17. The system of claim 16, wherein the system further comprises means for utilizing the second imaging camera to search for selected alignment marks in a predetermined area of the substrate.

18. The system of claim 17, wherein the second imaging camera includes means for transmitting image data associated with the selected alignment marks to the digital control system, and the digital control system includes means for determining coordinates of the selected alignment marks.

19. The system of claim 18, wherein the digital control system includes means for performing registration correction of the first droplet source in response to the coordinates of the selected alignment marks prior to the main printhead arriving at an unprocessed area for patterning.

* * * * *

UNITED STATES PATENT AND TRADEMARK OFFICE
CERTIFICATE OF CORRECTION

PATENT NO. : 7,559,619 B2  
APPLICATION NO. : 11/204648  
DATED : July 14, 2009  
INVENTOR(S) : Steven E. Ready et al.

Page 1 of 1

It is certified that error appears in the above-identified patent and that said Letters Patent is hereby corrected as shown below:

In the Specification:

Column 1, line 15, please delete "70NANBOH3033" and insert -- 70NANB7H3029 --.

Signed and Sealed this
Tenth Day of September, 2013

Teresa Stanek Rea
*Acting Director of the United States Patent and Trademark Office*